(12) United States Patent
Naaman et al.

(10) Patent No.: US 10,491,178 B2
(45) Date of Patent: Nov. 26, 2019

(54) PARAMETRIC AMPLIFIER SYSTEM

(71) Applicants: Ofer Naaman, Ellicott City, MD (US);
David George Ferguson, Takoma Park, MD (US)

(72) Inventors: Ofer Naaman, Ellicott City, MD (US);
David George Ferguson, Takoma Park, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/799,017

(22) Filed: Oct. 31, 2017

(65) Prior Publication Data

US 2019/0131944 A1   May 2, 2019

(51) Int. Cl.
*H03F 19/00* (2006.01)
*H03F 1/56* (2006.01)
*H03F 7/00* (2006.01)

(52) U.S. Cl.
CPC ............. *H03F 19/00* (2013.01); *H03F 1/565* (2013.01); *H03F 7/00* (2013.01); *H03F 2200/222* (2013.01)

(58) Field of Classification Search
CPC ....... H03F 19/00; H03F 1/565; H03F 2200/22
USPC .......................................................... 333/4
See application file for complete search history.

(56) References Cited

U.S. PATENT DOCUMENTS

| | | | |
|---|---|---|---|
| 3,341,380 A | 9/1967 | Mcts | |
| 4,117,354 A | 9/1978 | Geewala | |
| 4,132,956 A | 1/1979 | Russer | |
| 4,149,097 A | 4/1979 | Faris | |
| 4,274,015 A | 6/1981 | Faris | |
| 4,360,898 A | 11/1982 | Faris | |
| 4,916,335 A | 4/1990 | Goto | |
| 5,051,627 A | 9/1991 | Schneier | |
| 5,099,152 A | 3/1992 | Suzuki | |
| 5,309,038 A | 5/1994 | Harada | |
| 5,942,950 A | 8/1999 | Merenda | |

(Continued)

FOREIGN PATENT DOCUMENTS

| | | |
|---|---|---|
| EP | 0467104 | 1/1992 |
| EP | 3217336 | 9/2017 |

(Continued)

OTHER PUBLICATIONS

Berggren et al. "Analytical approximations to the dynamics of an array of coupled DC SQUIDs", The European Physical Journal B, 2014 (Year: 2014).*

(Continued)

*Primary Examiner* — Benny T Lee
*Assistant Examiner* — Hafizur Rahman
(74) *Attorney, Agent, or Firm* — Tarolli, Sundheim, Covell & Tummino LLP

(57) ABSTRACT

One example includes a parametric amplifier system. The system includes an input/output (I/O) transmission line to propagate a signal tone. The system also includes a nonlinearity circuit comprising at least one Josephson junction to provide at least one inductive path of the signal tone in parallel with the at least one Josephson junction. The system further includes an impedance matching network coupled to the I/O transmission line to provide impedance matching of the tone signal between the I/O transmission line and the non-linearity element.

20 Claims, 2 Drawing Sheets

(56) References Cited

U.S. PATENT DOCUMENTS

| | | |
|---|---|---|
| 6,188,236 B1 | 2/2001 | Wikborg |
| 6,486,756 B2 | 11/2002 | Tarutani |
| 6,507,234 B1 | 1/2003 | Johnson |
| 6,518,786 B2 | 2/2003 | Herr |
| 6,549,059 B1 | 4/2003 | Johnson |
| 6,617,643 B1 | 9/2003 | Goodwin-Johansson |
| 6,724,216 B2 | 4/2004 | Suzuki |
| 6,750,794 B1 | 6/2004 | Durand |
| 6,865,639 B2 | 3/2005 | Herr |
| 6,897,468 B2 | 5/2005 | Blais |
| 6,960,780 B2 | 11/2005 | Blais |
| 6,960,929 B2 | 11/2005 | Bedard |
| 7,129,870 B2 | 10/2006 | Hirano |
| 7,498,832 B2 | 3/2009 | Baumgardner |
| 7,613,765 B1 | 11/2009 | Hilton |
| 7,714,605 B2 | 5/2010 | Baumgardner |
| 7,724,020 B2 | 5/2010 | Herr |
| 7,772,871 B2 | 8/2010 | Herr |
| 7,772,872 B2 | 8/2010 | Lewis |
| 7,782,077 B2 | 8/2010 | Herr |
| 7,977,964 B2 | 7/2011 | Herr |
| 8,022,722 B1 | 9/2011 | Pesetski |
| 8,111,083 B1 | 2/2012 | Pesetski |
| 8,508,280 B2 | 8/2013 | Naaman |
| 8,654,578 B2 | 2/2014 | Lewis et al. |
| 8,975,912 B2 | 3/2015 | Chow |
| 9,000,621 B2 | 4/2015 | Ichikawa |
| 9,208,861 B2 | 12/2015 | Herr |
| 9,281,057 B1 | 3/2016 | Herr |
| 9,735,776 B1 | 8/2017 | Abdo |
| 10,122,352 B1 | 11/2018 | Miller |
| 2002/0063643 A1 | 5/2002 | Smith |
| 2002/0190381 A1 | 12/2002 | Herr |
| 2003/0011398 A1 | 1/2003 | Herr |
| 2003/0016069 A1 | 1/2003 | Furuta |
| 2003/0039138 A1 | 2/2003 | Herr |
| 2003/0040440 A1 | 2/2003 | Wire |
| 2003/0115401 A1 | 6/2003 | Herr |
| 2003/0183935 A1 | 10/2003 | Herr |
| 2003/0207766 A1 | 11/2003 | Esteve |
| 2004/0120444 A1 | 6/2004 | Herr |
| 2004/0201099 A1 | 10/2004 | Herr |
| 2004/0201400 A1 | 10/2004 | Herr |
| 2005/0001209 A1 | 1/2005 | Hilton |
| 2005/0023518 A1 | 2/2005 | Herr |
| 2005/0098773 A1 | 5/2005 | Vion |
| 2005/0110106 A1 | 5/2005 | Goto |
| 2005/0224784 A1 | 10/2005 | Amin |
| 2005/0231196 A1 | 10/2005 | Tarutani |
| 2006/0091490 A1 | 5/2006 | Chen |
| 2007/0052441 A1 | 3/2007 | Taguchi |
| 2009/0082209 A1 | 3/2009 | Bunyk |
| 2009/0084991 A1 | 4/2009 | Ichimura |
| 2009/0153180 A1 | 6/2009 | Herr |
| 2009/0289638 A1 | 11/2009 | Farinelli |
| 2009/0322374 A1 | 12/2009 | Przybysz |
| 2011/0175062 A1 | 7/2011 | Farinelli |
| 2012/0094838 A1 | 4/2012 | Bunyk |
| 2013/0015885 A1 | 1/2013 | Naaman |
| 2013/0043945 A1 | 2/2013 | McDermott |
| 2015/0092465 A1 | 4/2015 | Herr |
| 2015/0254571 A1 | 9/2015 | Miller et al. |
| 2017/0141769 A1 | 5/2017 | Miller et al. |
| 2018/0076777 A1* | 3/2018 | Hofheinz ............... H03F 1/565 |

FOREIGN PATENT DOCUMENTS

| | | |
|---|---|---|
| EP | 3378162 A1 | 9/2018 |
| JP | S6192036 | 5/1986 |
| JP | 2001345488 | 12/2001 |
| JP | 2004080129 A | 3/2004 |
| WO | 199808307 | 2/1998 |
| WO | 2003090162 | 10/2003 |
| WO | 2005093649 | 10/2005 |
| WO | 2008050864 | 5/2008 |
| WO | 2009157532 | 12/2009 |
| WO | 2010028183 | 3/2010 |
| WO | 2016127021 | 8/2016 |
| WO | 2017087070 A1 | 5/2017 |

OTHER PUBLICATIONS

Beltran, "Development of a Josephson Parametric Amplifier for the Preparation and Detection of Non-classical States of Microwave Fields", University of Colorado, 2010. (Year: 2010).*

Marino, M.D., "RFiof: An RF Approach to I/O-pin and Memory Controller Scalability for Off-chip Memories", May 2013 (Year: 2013).*

Bems et al., "Coherent Quasiclassical Dynamics of a Persistent Current Qubit", Physical Review Letters APS USA, vol. 97, No. 15, pp. 150502, Oct. 13, 2006.

Garanin et al., Effects of nonlinear sweep in the Landau-Zener-Stueckelberg effect, Physical Review B, vol. 66, No. 17, pp. 174438-1-174438-11, Nov. 1, 2002.

Koch, et al.: "A NRZ—Output Amplifier for RSFQ Circuits", IEEE Transaction on Applied Superconductivity, vol. 9, No. 2, pp. 3549-3552, Jun. 1999.

Wulf et al., Dressed States of Josephson Phase Qubit Coupled to an LC Circuit, IEEE Transaction on Applied Superconductivity IEEE USA, vol. 15, No. 2, pp. 356-859, Jun. 2, 2005.

Schuenemann C. et al. "Interleaved Josephson junction tree decoder," IBM Technical Disclosure Bulletin, International Business Machines Corp. (Thorwood), US, vol. 18, No. 12, Apr. 30, 1976, pp. 4168, line 1-p. 4170, line 29; figures I, II.

International Search Report & Written Opinion corresponding to International Application No. PCT/US2018/051076 dated Jan. 2, 2019.

International Search Report & Written Opinion corresponding to International Application No. PCT/US2018/0042466 dated Dec. 12, 2018.

International Search Report & Written Opinion corresponding to International Application No. PCT/US2008/050864 dated Sep. 6, 2008.

Internation Search Report & Written Opinion corresponding to International Application No. PCT/US2008/072017 dated Feb. 23, 2009.

Gopalakrishnan, R. et al.: "Novel Very High IE Structures Based on the Directed BBHE Mechanism for Ultralow-Power Flash Memories", IEEE Electron Device Letters, vol. 26, No. 3, Mar. 2005.

Choi, W. Y. et al.: "80nm Self-Aligned Complementary I-MOS Using Double Sidewall Spacer and Elevated Drain Structure and Its Applicability to Amplifiers with High Linearity", IEEE Electron Device Letters, vol. 8, No. 5, dated 2004.

Choi, W. Y. et al.: "Novel Tunneling Devices with Multi-Functionality", Japanese Journal of Applied Physics, vol. 16, No. 1B, dated 2007; pp. 2622-2625.

International Search Report corresponding to International Application No. PCT/US2009/045167, dated Feb. 5, 2010.

Semenov, et. al, "SFQ Control Circuits for Josephson Junction Qubits", IEEE Trans. On Applied Superconductivity, vol. 13, No. 2, Jun. 2003, pp. 960-965.

Canadian Office Action corresponding to Canadian Patent Application No. 2882109 dated Mar. 11, 2016.

Polonsky, et. al., "Transmission of Single-Flux-Quantum Pulses along Superconducting Microstrip Lines," IEEE Trans. On Applied Superconductivity, vol. 3, No. 1, Mar. 1993, pp. 2598-2600.

Ohki et. al., "Low-Jc Rapid Single Flux Quantum (RSFQ) Qubit Control Circuit", IEEE Transactions on Applied Superconductivity, vol. 17, No. 2, Jun. 2007.

Allman, et al: "rt-SQUID-Mediated Coherent Tunable Coupling Between a Superconducting Phase Qubit and a Lumped-Element Resonator" ; Physical Review Letters, 2010 The American Physical Society, PRL 104, week ending Apr. 30, 2010, pp. 177004-1 thru 177004-4.

Johnson, et al.: "A Scalable Control System for a Superconducting Adiabatic Quantum Optimization Processor" ; arXiv:0907.3757v2 fquant-phl Mar. 24, 2010, pp. 1-14.

(56) References Cited

OTHER PUBLICATIONS

Saira, et al.: "Entanglement genesis by anciila-based parity measurement in 20 circuit QED" Physical review letters 1 i 2.7 (201 4): 070502.

Galiautdinov, et al.: "Resonator-zero-qubit architecture for superconducting qubits" Physical Review A 85.4 (201 2): 042321, Department of Electrical Engineering and Physics, University of California. pp. 1-11.

Bourassa, et al.: " Ultra.strong coupling regime of cavity QED with phase-biased flux qubits" Physical Review A 80.3 (2009): 032109.

International Search Report corresponding to International Application No. PCT/US2015/052666 dated Jan. 3, 2016.

RSFQubit , RSFQ Control of Josephson Junctions Qubits, D7: Report on the Evaluation of the RSFQ Circuitry for Qubit Control, Sep. 1, 2005, pp. 1-16.

Herr, et al: "Ultra-Low-Power Superconductor Logic", Journal of Applied Physics, American Institute of Physics, US, vol. 109, No. 10, May 17, 2011, pp. 103903-103903, XP012146891, ISSN: 0021-8979, 001: 10.1063/1.3585849, p. 2, left-hand column, paragraph 4-right-hand column, paragraph 1; Fig. 1.

Gui-Long, et al., "A Simple Scheme to Generate X-type Four-charge Entangled States in Circuit QED", Chinese Physics B, Chinese Physics B, Bristol GB, vol. 21, No. 4, Apr. 5, 2012 (Apr. 5, 2012), pp. 44209/1-5. XP020221550, ISSN: 1674-1056, DOI: 10.1088/1674-1056/21/41044209.

International Search Report corresponding to International Application No. PCT/US2016/053412, dated Dec. 21, 2016.

International Search Report corresponding to International Application No. PCT/US2013/054161, dated Feb. 25, 2014.

Canadian Office Action corresponding to Canadian Patent Application No. 2973060, dated Dec. 18, 2018.

International Search Report and Written Opinion for PCT/US2019/030036 dated Jul. 19, 2019.

Canadian Office Action corresponding to Canadian Patent Application No. 3003272 dated Feb. 12, 2019.

Korean Office Action corresponding to Korean Application No. 10-2018-7013489 dated Mar. 28, 2019.

\* cited by examiner

PARAMETRIC AMPLIFIER SYSTEM

TECHNICAL FIELD

This disclosure relates generally to classical and quantum computing systems, and more specifically to a parametric amplifier system.

BACKGROUND

A parametric oscillator is a driven harmonic oscillator in which the oscillations are driven by varying some parameter of the system at some frequency, typically different from the natural frequency of the oscillator. A parametric oscillator can amplify a signal as a parametric amplifier, such as when operated at pump levels below oscillation. A typical parametric amplifier can exhibit much lower noise than an ordinary amplifier based on a gain device like a transistor or vacuum tube based on varying a reactance instead of resistance. An example of a parametric oscillator is a varactor parametric amplifier that operates as a low-noise amplifier in the radio and microwave frequency range. A varactor parametric amplifier can provide non-linear adjustment to the reactance of a given microwave signal via a varactor diode. Applications that require a parametric amplifier can require both high bandwidth and high gain, which can sometimes result in trade-offs in a given parametric amplifier design.

SUMMARY

One example includes a parametric amplifier system. The system includes an input/output (I/O) transmission line to propagate a signal tone. The system also includes a non-linearity circuit comprising at least one Josephson junction to provide at least one inductive path of the signal tone in parallel with the at least one Josephson junction. The system further includes an impedance matching network coupled to the I/O transmission line to provide impedance matching of the tone signal between the I/O transmission line and the non-linearity element.

Another example includes a parametric amplifier system. The system includes an I/O transmission line to propagate a signal tone and at least one impedance matching element coupled to the I/O transmission line to provide a frequency pole associated with the signal tone. The system also includes a non-linearity circuit comprising at least one Josephson junction to provide at least one inductive path of the signal tone in parallel with the at least one Josephson junction.

Another example includes a parametric amplifier system. The system includes an I/O transmission line to propagate a signal tone and at least one impedance matching element coupled to the I/O transmission line to provide a frequency pole associated with the signal tone. The system also includes a non-linearity circuit comprising a plurality of RF superconducting quantum interference devices (SQUIDs) arranged in alternating orientations in an array between a first terminal of the non-linearity circuit and a second terminal of the non-linearity circuit to provide at least one inductive path of the signal tone.

DETAILED DESCRIPTION

This disclosure relates generally to classical and quantum computing systems, and more specifically to a parametric amplifier system. The parametric amplifier system can be implemented in any of a variety of classical and quantum computer systems that may require amplification of a signal tone, such as for a state-readout of a qubit. The parametric amplifier system can include an input/output (I/O) transmission line on which a high-frequency signal tone (e.g., having a center frequency of approximately 7.5 GHz) can propagate. As an example, the I/O transmission line can correspond to both an input and output associated with the signal tone, such that the amplified output signal tone can be reflected back to the I/O transmission line and can be separated from the input signal tone at the I/O transmission line (e.g., via a circulator). As a result, the output signal tone can be provided from the I/O transmission line and processed (e.g., via an analog-to-digital converter (ADC)).

The parametric amplifier also includes at least one impedance matching element to provide a respective at least one frequency pole with respect to the signal tone. As an example, each of the impedance matching element(s) can be configured as a resonator coupled to the I/O transmission line, and can each be separated by a reactive circuit element (e.g., a capacitor or an inductor). The parametric amplifier further includes a non-linearity circuit that is configured to provide the amplification of the signal tone. As an example, the non-linearity circuit can include at least one Josephson junction that is arranged in parallel with at least one inductive path of the signal tone. For example, the non-linearity circuit can include a plurality of RF superconducting quantum interference devices (SQUIDs) that are arranged in an alternating series arrangement. Each of the RF SQUIDs can include a Josephson junction and a pair of inductors that form an inductive path in parallel with the respective Josephson junction. For example, the arrangement of the RF SQUIDs can include two inductive paths in parallel, such that two series RF SQUID arrangements can be provided in parallel between respective terminals of the non-linearity circuit. As a result, the parametric amplifier can achieve sufficient gain (e.g., at least approximately 20 dB) over a large bandwidth (e.g., at least approximately 1 GHz) with a high saturation power (e.g., approximately −90 dB).

Figure 1:
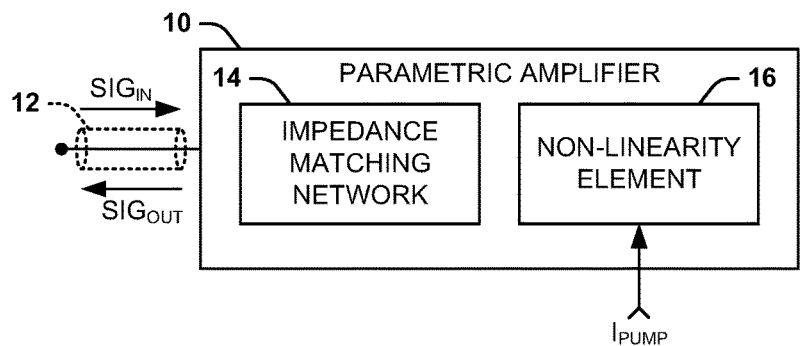
FIG. 1 illustrates an example of a parametric amplifier system.

FIG. 1 illustrates an example of a parametric amplifier system 10. The parametric amplifier system 10 can be implemented in any of a variety of classical and quantum computer systems that may require amplification of a signal tone, such as for a state-readout of a qubit.

The parametric amplifier system 10 includes an input/output (I/O) transmission line 12 on which a high-frequency signal tone, demonstrated in the example of FIG. 1 as a signal SIG, can propagate. As an example, the signal tone SIG can have a frequency in a range of frequencies encompassing a frequency band of at least approximately 1.6 GHz that can be centered at approximately 7.5 GHz. In the example of FIG. 1, the I/O transmission line 12 can correspond to both an input with respect to an input signal tone $SIG_{IN}$ and an output signal tone $SIG_{OUT}$ associated with the signal tone SIG. As an example, the amplified output signal tone $SIG_{OUT}$ can be reflected back to the I/O transmission line 12 and can be separated from the input signal tone $SIG_{IN}$ at the I/O transmission line 12 (e.g., via a circulator). As a result, the output signal tone $SIG_{OUT}$ can be provided from the I/O transmission line 12 and processed, such as via an analog-to-digital converter (ADC) at a receiver.

As an example, the I/O transmission line 12 can have an impedance $Z_0$ of approximately 50Ω. The parametric amplifier system 10 also includes an impedance matching network 14 that is configured to provide at least one frequency pole with respect to the signal tone SIG. As an example, the impedance matching network 14 can include at least one impedance matching element to provide the respective at least one frequency pole with respect to the signal tone SIG. As an example, each of the impedance matching element(s) can be configured as a resonator coupled to the I/O transmission line 12, and can each be separated by a capacitor. Thus, the impedance matching network 14 can provide impedance matching of the signal tone SIG with respect to amplification of the signal tone SIG, as described in greater detail herein.

The parametric amplifier system 10 further includes a non-linearity circuit 16. The non-linearity circuit 16 is configured to provide parametric amplification of the input signal tone $SIG_{IN}$ to provide the amplified output signal tone $SIG_{OUT}$. As an example, the non-linearity circuit 16 can include at least one Josephson junction that is arranged in parallel with at least one inductive path of the signal tone SIG. For example, the non-linearity circuit 16 can include a plurality of RF superconducting quantum interference devices (SQUIDs) that are arranged in an alternating arrangement along an array. Each of the RF SQUIDs can include a Josephson junction and a pair of inductors that form an inductive path of the signal tone SIG in parallel with the respective Josephson junction. For example, the arrangement of the RF SQUIDs can include two inductive paths in parallel, such that two RF SQUID arrays can be provided in parallel between respective terminals of the non-linearity circuit 16.

Additionally, in the example of FIG. 1, the non-linearity circuit 16 receives a pump current $I_{PUMP}$. As an example, the pump current $I_{PUMP}$ can have a DC component and an AC component that can have a frequency that is approximately twice an operational center frequency of the amplifier (e.g., approximately 15 GHz for a parametric amplifier system 10 operating at 7.5 GHz). For example, the pump current $I_{PUMP}$ can be provided to periodically change the inductance of non-linear elements (e.g., Josephson junction(s)) in the non-linearity circuit 16 to amplify the signal tone SIG.

Figure 2:
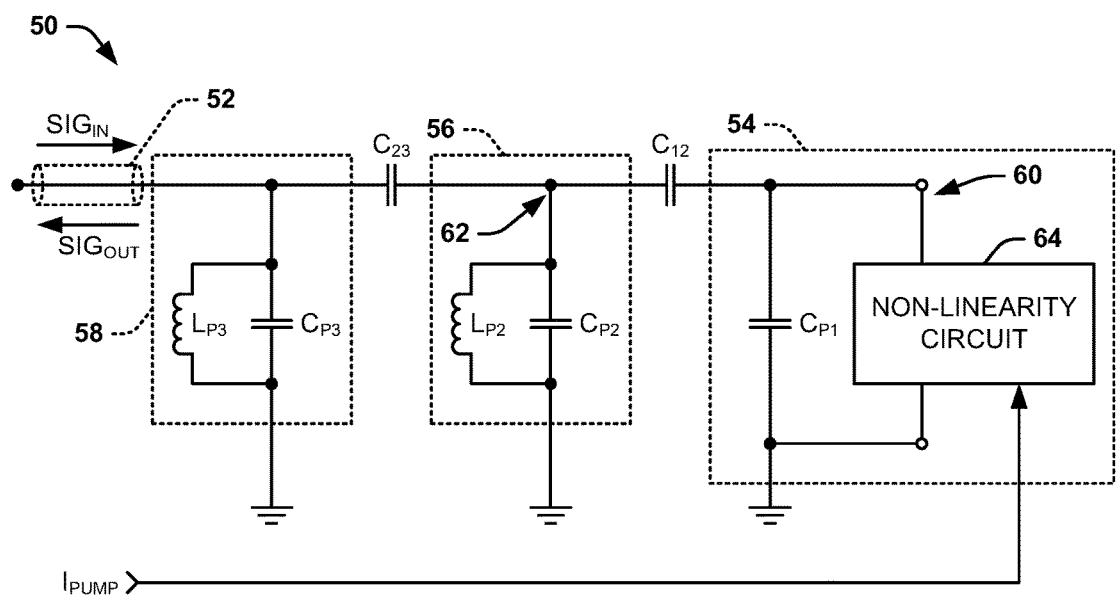
FIG. 2 illustrates another example of a parametric amplifier system.

FIG. 2 illustrates an example of a parametric amplifier system 50. The parametric amplifier system 50 can be implemented in any of a variety of classical and quantum computer systems that may require amplification of a signal tone, such as for a state-readout of a qubit. As an example, the parametric amplifier system 50 can correspond to the parametric amplifier system 10 in the example of FIG. 1.

The parametric amplifier system 50 includes an I/O transmission line 52 on which a high-frequency signal tone, demonstrated in the example of FIG. 2 as including the input signal tone $SIG_{IN}$ and the output signal tone $SIG_{OUT}$. As an example, the amplified output signal tone $SIG_{OUT}$ can be reflected back to the I/O transmission line 52 and can be separated from the input signal tone $SIG_{IN}$ at the I/O transmission line 52 (e.g., via a circulator). The parametric amplifier system 50 also includes a plurality of impedance matching elements. In the example of FIG. 2, the impedance matching elements are demonstrated as a first impedance matching element 54, a second impedance matching element 56 that is separated from the first impedance matching element 54 by a capacitor $C_{12}$, and a third impedance matching element 58 that is coupled to the I/O transmission line 52 and separated from the second impedance matching element 56 by a capacitor $C_{23}$.

The first impedance matching element 54 includes a capacitor $C_{P1}$ arranged between a node 60 coupled to the capacitor $C_{12}$ and the low-voltage rail, demonstrated in the example of FIG. 2 as ground. The second impedance matching element 56 includes an inductor $L_{P2}$ and a capacitor $C_{P2}$ arranged in parallel between a node 62 interconnecting the capacitor $C_{12}$ and $C_{23}$ and the low-voltage rail. The third impedance matching element 58 includes an inductor $L_{P3}$ and a capacitor $C_{P3}$ arranged in parallel between the I/O transmission line 52 and the low-voltage rail. Each of the impedance matching elements 54, 56, and 58 are configured to provide a frequency pole with respect to the signal tone SIG. As an example, the impedance matching elements 54, 56, and 58 can collectively correspond to the impedance matching network 14 in the example of FIG. 1.

The parametric amplifier system 50 further includes a non-linearity circuit 64 that forms part of the first impedance matching element 54. The non-linearity circuit 64 is configured to provide parametric amplification of the input signal tone $SIG_{IN}$ to provide the amplified output signal tone $SIG_{OUT}$. In the example of FIG. 2, the non-linearity circuit 64 is provided a pump current $I_{PUMP}$ that can pump a flux associated with the non-linearity circuit 64 (e.g., with respect to a plurality of RF SQUIDs). For example, the pump current $I_{PUMP}$ can have a DC component and a high-frequency AC component, such as having a frequency that is twice an operational center frequency of the frequency band of the parametric amplifier system 50 (e.g., approximately 15 GHz with respect to an approximately 7.5 GHz center frequency). As a result, the pump current $I_{PUMP}$ can modulate an inductance associated with the non-linearity circuit 64. The non-linearity circuit 64 can be configured to have an effective admittance $Y_{sq}(\omega_0)$, where $\omega_0$ corresponds to a center frequency of the frequency band that the signal tone SIG can occupy, such that the impedance matching network composed of the impedance matching elements 54, 56, and 58 can provide a three-pole bandpass network to match between the effective load $Y_{sq}(\omega_0)$ to the I/O transmission line 52 (e.g., $Z_0$=approximately 50Ω). As an example, the pumped non-linearity in the parametric amplifier system can provide the signal port with an effective negative resistance, giving rise to reflection gain. For example, based on a three-pole impedance matching network provided by the impedance matching elements 54, 56, and 58, the parametric amplifier system 50 can have a bandwidth of approximately 1.6 GHz.

Figure 3:
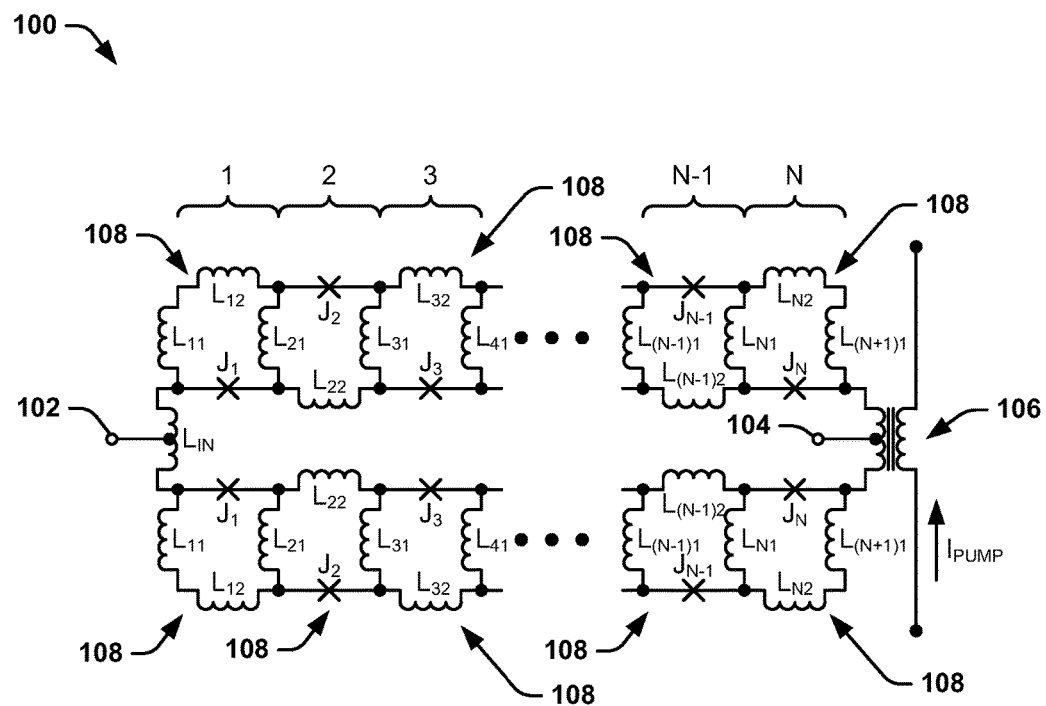
FIG. 3 illustrates an example of a non-linearity circuit.

FIG. 3 illustrates an example of a non-linearity circuit 100. The non-linearity circuit 100 can correspond to the non-linearity circuits 16 and 64 in the respective examples of FIGS. 1 and 2. Therefore, reference is to be made to the examples of FIGS. 1 and 2 in the following description of the example of FIG. 3.

The non-linearity circuit 100 includes a first terminal 102 and a second terminal 104 that can correspond to the terminals coupled to the node 60 and the low-voltage rail, respectively, in the example of FIG. 2. The first terminal 102 is coupled to an input inductor $L_{IN}$ in a manner that the input inductor $L_{IN}$ provides an approximate equal inductance to the signal tone SIG in each of two arrays of the non-linearity circuit 100, as described in greater detail herein. The second terminal 104 is coupled to a secondary winding of a transformer 106, with the primary winding of the transformer 106 being configured to conduct the pump current $I_{PUMP}$. In addition, the non-linearity circuit 100 includes a plurality 2×N of RF SQUIDs 108, with the arrangement of RF SQUIDs 108 being arranged in two parallel alternating array sequences of N RF SQUIDs 108 between the first and second terminals 102 and 104. As an example, N=20. Thus, the two N-sequence arrays of RF SQUIDs 108 are demonstrated as mirror-images with respect to each other between the first and second terminals 102 and 104.

Each of the RF SQUIDs 108 includes a pair of inductors and a Josephson junction. In each of the two N-sequence arrays of RF SQUIDs 108, the inductors are labeled $L_{X1}$ and $L_{X2}$, with X corresponding to the number of the respective RF SQUID 108 along the respective array of the RF SQUIDs 108. Similarly, in each of the two N-sequence arrays of RF SQUIDs 108, the Josephson junctions are labeled $J_X$. As an example, all of the Josephson junctions $J_X$ can have an approximately equal critical current $I_C$. In the example of FIG. 3, the first inductor $L_{X1}$ of each of the RF SQUIDs 108, with the exception of $L_{11}$, is common to a preceding RF SQUID 108 in the sequence of RF SQUIDs 108. Additionally, the Nth RF SQUID 108 includes an additional inductor $L_{(N+1)1}$ that is coupled to the secondary winding of the transformer 106. As described herein, in the example of FIG. 3, the inductors $L_{X1}$ and $L_{X2}$ of the RF SQUIDs 108 form a pair of inductor inductive paths of the signal tone SIG between the first and second terminals 102 and 104, with each of the inductive paths being provided through the inductors $L_{X1}$ and $L_{X2}$ in parallel with each of the respective Josephson junctions $J_X$. As a result, the cumulative non-linear effect of the plurality of Josephson junctions $J_X$ can be achieved in a manner that distributes the Josephson junctions $J_X$ through the inductive path to achieve a greater critical current of the respective Josephson junctions $J_X$ while providing a cumulative inductance of each of the arrays of RF SQUIDs 108 to be greater than an inductance of any one of the Josephson junctions $J_X$. As a result, the non-linearity circuit 100 can achieve parametric amplification in a manner that substantially mitigates spurious triggering of the Josephson junctions $J_X$. Accordingly, the parametric amplifier system 50 can achieve parametric amplification across a larger bandwidth with a high saturation power and a high gain relative to typical Josephson junction parametric amplifier systems.

As an example, with reference to FIGS. 2 and 3, the first pole of the impedance matching element 54 is comprised of the linear inductance $L_a(\Phi_{dc})$ in parallel with a shunt capacitance $C_1$ (not shown). The choices for the capacitor $C_1$ and $\omega_0$ determine the required flux bias $\Phi_{dc}$ operating point as follows:

$$L_a(\Phi_{dc}) = 1/\omega_0^2 C_1 \qquad \text{Equation 1}$$

Additionally, the choices for $C_1$ and $\omega_0$ determine the impedance of the resonator of the first impedance matching element 54, $Z_1$, as follows:

$$Z_1 = \sqrt{\frac{L_a(\Phi_{dc})}{C_1}} \qquad \text{Equation 2}$$

Similarly, the other two poles of the respective impedance matching elements 56 and 58 are formed with the impedances $Z_2$ and $Z_3$ as follows:

$$Z_2 = \sqrt{\frac{L_{p2}}{C_2}} \qquad \text{Equation 3}$$

$$Z_3 = \sqrt{\frac{L_{p3}}{C_3}} \qquad \text{Equation 4}$$

The resonators of the impedance matching elements 54, 56, and 58 are coupled via admittance inverters $J_{ij}$ having values that can be calculated from tabulated filter prototypes $\{g_i\}$ as follows:

$$J_{12} = w/\sqrt{Z_1 * Z_2 * g_1 * g_2} \qquad \text{Equation 5}$$

$$J_{34} = w/\sqrt{Z_1 * Z_2 * g_1 * g_2} \qquad \text{Equation 6}$$

Where: $Z_0 = 50\Omega$; and
w is the fractional bandwidth, defined as:

$$w * |R_{sq}|/Z_1 = g_1. \qquad \text{Equation 7}$$

Where: $R_{sq} = 1/\text{Re}\{Y_{sq}\}$

As an example, the impedance $Z_3$ of the third impedance matching element 58 can be selected as follows:

$$Z_3 = w * Z_0/g_3 * g_4 \qquad \text{Equation 8}$$

As another example, the impedance $Z_2$ of the second impedance matching element 56 can be selected as follows:

$$Z_2 = \sqrt{Z_1 * Z_3} \qquad \text{Equation 9}$$

As another example, the admittance inverters can be arranged as capacitive pi-sections to form the parametric amplifier system 50, such that:

$$C_{ij} = J_{ij}/\omega_0 \qquad \text{Equation 10}$$

Where:

$$C_{p1} = C_1 - C_{12} \qquad \text{Equation 11}$$

$$C_{p2} = C_2 - C_{12} - C_{23} \qquad \text{Equation 12}$$

$$C_{p3} = C_3 - C_{23} \qquad \text{Equation 13}$$

As a result, the admittance $Y_{ext}(\omega)$ associated with the non-linear element 64 and 100 looking through the impedance matching network formed by the impedance matching elements 54, 56, and 58 to the exemplary $50\Omega$ impedance $Z_0$ of the I/O transmission line 52 can be evaluated at the center of the frequency band as follows:

$$Y_{ext}(\omega_0) = j\omega_0 C_1 + \left(\frac{J_{12}}{J_{23}}\right)^2 * 1/Z_0 \qquad \text{Equation 14}$$

Accordingly, the parametric amplifier system 50 can be designed based on Equations 1-14 to provide sufficient impedance matching for the Josephson non-linearity of the non-linearity circuit 64 and 100.

As an example, the amplitude of the pump current $I_{PUMP}$ can be selected to provide a desired pump amplitude $\Phi_{ac}$, and thus gain of the parametric amplifier system 50, based on the admittance $Y_{sq}$ of the non-linearity circuit 100. As an example, flux-pumped non-linearity can be provided as follows:

$$Y_{sq}(\omega_s) = 1/j\omega_s L_a + 1/j\omega_s(L_b + L_c) \qquad \text{Equation 15}$$

Where: $\omega_s$ is the frequency of the signal tone SIG;
$L_a = L_T(\Phi_{dc})$; and $$L_b = -\frac{4L_T^3(\Phi_{dc})}{L_T'(\Phi_{dc})^2} \frac{1}{\Phi_{ac}^2}$$ Equation 16

$$L_c = -\frac{4i\omega_i L_T^4(\Phi_{dc}) Y_{ext}^*(\omega_i)}{L_T'(\Phi_{dc})^2} \frac{1}{\Phi_{ac}^2}$$ Equation 17

Where: $L'_T(\Phi_{ac})$ is the flux derivative of the inductance evaluated at the operating point of the parametric amplifier system 50;

$\omega_i$ is an idler frequency expressed as $\omega_i = \omega_p - \omega_s$, and $\omega_p$ is the frequency of the pump current As described previously, the non-linearity circuit 100 is demonstrated as being formed as two arrays of RF SQUIDs, with each of the N stages of each of the arrays being composed of a Josephson junction $J_X$ having a critical current $I_C$ shunted by the respective linear inductors $L_{X1}$ and $L_{X2}$. Therefore, the inductance of the two arrays in parallel, and the flux derivative $L'_T(\Phi_{ac})$, can be expressed as:

$$L_T(\delta_0(\Phi_{dc})) = \frac{N}{2} \frac{(L_1+L_2)L_J + L_1 L_2 \cos \delta_0}{L_J + (4L_1 + L_2) \cos \delta_0}$$ Equation 18

$$L'_T(\delta_0(\Phi_{dc})) = \frac{(2L_1+L_2)^3 L_J^2 \pi \sin \delta_0}{2\Phi_0[(L_1+L_2)L_J + L_1 L_2 \cos \delta_0]}$$

$$[L_J + (4L_1 + L_2) \cos \delta_0]^2$$ Equation 19

$$L_J = \hbar/2eI_c$$ Equation 20

Where: $\Phi_0$ is a flux quantum, and $\delta_0(\Phi_{dc})$ can be expressed as:

$$\left(\frac{1}{L_1} + \frac{1}{L_2}\right)\delta_0 + \frac{1}{L_J} \sin \delta_0 = \frac{\pi \Phi_{dc}}{N\Phi_0}\left(\frac{1}{L_1} + \frac{1}{L_2}\right)$$ Equation 21

Therefore, based on Equations 15-21, in combination with Equation 14, an amplitude of the pump current $I_{PUMP}$ can be selected to provide a pump amplitude $\Phi_{ac}$ for which the expression:

$$R_{sq} = 1/\text{Re}\{Y_{sq}(\omega_0)\}$$ Equation 22 can satisfy the constraint of Equation 7 at the center of the operation frequency band.

As a result of the arrangement of the non-linearity circuit 64 and 100 in combination with the impedance matching network formed by the impedance matching elements 54, 56, and 58, the parametric amplifier system 50 can provide parametric amplification of the signal tone SIG at high gain, higher saturation power (e.g., relative to typical Josephson parametric amplifiers), and over a large bandwidth. As an example, the admittance at an idler frequency $Y_{ext}(\omega_p - \omega_s)$ for a given signal frequency $\omega_s$ can be evaluated to calculate the admittance of the pumped non-linearity $Y_{sq}(\omega_s)$. Therefore, the impedance of the parametric amplifier system 50, as seen from the exemplary 50Ω impedance $Z_0$ of the I/O transmission line 52 to an overall impedance of the parametric amplifier system 50, $Z_{amp}(\omega_s)$, and the signal power gain can be calculated as follows:

$$G(\omega_s) = 20 * \log_{10}\left|\frac{Z_{amp}(\omega_s) - Z_0}{Z_{amp}(\omega_s) + Z_0}\right|$$ Equation 23

Accordingly, the parametric amplifier system 50 can be implemented with the impedance matching network of the impedance matching elements 54, 56, and 58 and the non-linearity circuit 100 to achieve broadband performance and to achieve higher gain and bandwidth, with minimum ripple, relative to typical Josephson junction parametric amplifiers. Additionally, the RF SQUID arrays of the non-linearity element 100 can be implemented to achieve high saturation powers relative to typical Josephson junction parametric amplifier systems.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A parametric amplifier system comprising:
   an input/output (I/O) transmission line to propagate a signal tone;
   a non-linearity circuit comprising at least one Josephson junction and at least one inductive path that provides the signal tone in parallel with the at least one Josephson junction; and
   an impedance matching network coupled to the I/O transmission line to provide impedance matching of the signal tone between the I/O transmission line and the non-linearity circuit.

2. The system of claim 1, wherein the at least one Josephson junction is a plurality of Josephson junctions that are each individually arranged in parallel with separate portions of the at least one inductive path.

3. The system of claim 2, wherein the non-linearity circuit comprises a plurality of radio frequency (RF) superconducting quantum interference devices (SQUIDs) arranged in an array between a first terminal of the non-linearity circuit and a second terminal of the non-linearity circuit, wherein each of the plurality of RF SQUIDs comprises a respective one of the plurality of Josephson junctions.

4. The system of claim 3, wherein each of the RF SQUIDs comprises a respective one of the at least one Josephson junction, wherein the RF SQUIDs are arranged in an alternating pattern to provide the at least one inductive path in parallel with the respective Josephson junction associated with each of the RF SQUIDs.

5. The system of claim 3, wherein each of the RF SQUIDs comprises a first inductor and a second inductor, the first inductor interconnecting the respective one of the RF SQUIDs and a previous one of the RF SQUIDs in the array to provide flux to the respective one of the RF SQUIDs and the previous one of the RF SQUIDs in response to the signal tone.

6. The system of claim 3, wherein the plurality of RF SQUIDs are arranged as a first array of RF SQUIDs and a second array of RF SQUIDs arranged in parallel between the first and second terminals of the non-linearity circuit.

7. The system of claim 1, wherein the non-linearity circuit comprises a transformer to inductively couple a pump current to the at least one inductive path that provides the signal tone.

8. The system of claim 1, wherein the impedance matching network comprises at least one impedance matching element configured to provide a respective at least one frequency pole associated with the signal tone.

9. The system of claim 8, wherein each of the at least one impedance matching element comprises a resonator configured as an inductor and a capacitor arranged in parallel, each of the at least one impedance matching elements being interconnected to the I/O transmission line via a capacitor.

10. The system of claim 1, wherein the impedance matching network comprises a plurality of impedance matching elements configured to provide a respective plurality of frequency poles associated with the signal tone, wherein one of the plurality of impedance matching elements comprises the non-linearity circuit arranged in parallel with a capacitor between a capacitive coupling to another of the plurality of impedance matching elements and a low-voltage rail.

11. A parametric amplifier system comprising:
    an input/output (I/O) transmission line to propagate a signal tone;
    at least one impedance matching element coupled to the I/O transmission line to provide a frequency pole associated with the signal tone; and
    a non-linearity circuit comprising a plurality of Josephson junctions that are each individually arranged in parallel with separate portions of at least one inductive path of the signal tone.

12. The system of claim 11, wherein the non-linearity circuit comprises a plurality of radio frequency (RF) superconducting quantum interference devices (SQUIDs) arranged in an array between a first terminal of the non-linearity circuit and a second terminal of the non-linearity circuit, wherein each of the plurality of RF SQUIDs comprises a respective one of the plurality of Josephson junctions.

13. The system of claim 12, wherein each of the RF SQUIDs comprises a respective one of the plurality of Josephson junctions, wherein the RF SQUIDs are arranged in an alternating pattern to provide the at least one inductive path in parallel with the respective Josephson junction associated with each of the RF SQUIDs.

14. The system of claim 12, wherein each of the RF SQUIDs comprises a first inductor and a second inductor, the first inductor interconnecting the respective one of the RF SQUIDs and a previous one of the RF SQUIDs in the array to provide flux to the respective one of the RF SQUIDs and the previous one of the RF SQUIDs in response to the signal tone.

15. The system of claim 12, wherein the plurality of RF SQUIDs are arranged as a first array of RF SQUIDs and a second array of RF SQUIDs arranged in parallel between the first and second terminals of the non-linearity circuit.

16. The system of claim 11, wherein the non-linearity circuit comprises a transformer to inductively couple a pump current to the at least one inductive path of the signal tone.

17. A parametric amplifier system comprising:
    an input/output (I/O) transmission line to propagate a signal tone;
    at least one impedance matching element coupled to the I/O transmission line to provide a frequency pole associated with the signal tone; and
    a non-linearity circuit comprising a plurality of radio frequency (RF) superconducting quantum interference devices (SQUIDs) arranged in alternating orientations in an array between a first terminal of the non-linearity circuit and a second terminal of the non-linearity circuit to provide at least one inductive path of the signal tone.

18. The system of claim 17, wherein the non-linearity circuit comprises a plurality of Josephson junctions that are each individually arranged in parallel with separate portions of the at least one inductive path.

19. The system of claim 17, wherein each of the RF SQUIDs comprises a first inductor and a second inductor, the first inductor interconnecting the respective one of the RF SQUIDs and a previous one of the RF SQUIDs in the array to provide flux to the respective one of the RF SQUIDs and the previous one of the RF SQUIDs in response to the signal tone.

20. The system of claim 17, wherein the plurality of RF SQUIDs are arranged as a first plurality of RF SQUIDs and a second plurality of RF SQUIDs arranged in parallel between the first and second terminals of the non-linearity circuit.

* * * * *